US011677404B1

(12) United States Patent
Harush (10) Patent No.: US 11,677,404 B1
(45) Date of Patent: Jun. 13, 2023

(54) INDEPENDENTLY CLOCKING DIGITAL LOOP FILTER BY TIME-TO-DIGITAL CONVERTER IN DIGITAL PHASE-LOCKED LOOP

(71) Applicant: Cypress Semiconductor Corporation, San Jose, CA (US)

(72) Inventor: Avri Harush, Herzeliya (IL)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 17/704,578

(22) Filed: Mar. 25, 2022

(51) Int. Cl.
 *H03L 7/093* (2006.01)
 *G04F 10/00* (2006.01)
 *H03L 7/099* (2006.01)

(52) U.S. Cl.
 CPC ............ *H03L 7/093* (2013.01); *G04F 10/005* (2013.01); *H03L 7/099* (2013.01)

(58) Field of Classification Search
 CPC ........ H03L 7/093; H03L 7/099; G04F 10/005
 See application file for complete search history.

(56) References Cited

U.S. PATENT DOCUMENTS

| | | | | |
|---|---|---|---|---|
| 10,075,175 B2 * | 9/2018 | Park | ...................... | G04F 10/005 |
| 10,715,155 B1 * | 7/2020 | Parvizi | ...................... | H03L 7/089 |
| 11,025,260 B1 * | 6/2021 | Chao | ........................ | H03L 7/093 |
| 11,036,253 B1 * | 6/2021 | Paternoster | ........... | H03L 7/0995 |
| 11,424,748 B1 * | 8/2022 | Geetla | ................... | H03L 7/0992 |
| 11,569,831 B1 * | 1/2023 | Grimaldi | ............... | G04F 10/005 |
| 2004/0208256 A1 * | 10/2004 | Spijker | ..................... | H03L 7/18 375/276 |
| 2009/0141845 A1 * | 6/2009 | Ballantyne | .............. | H03L 7/087 375/376 |
| 2009/0262878 A1 * | 10/2009 | Sun | ......................... | H03L 7/085 375/376 |
| 2013/0002317 A1 * | 1/2013 | Frantzeskakis | ........... | H03L 7/08 327/156 |
| 2017/0201260 A1 * | 7/2017 | Unruh | ..................... | H03L 7/091 |
| 2017/0205772 A1 * | 7/2017 | Burg | ..................... | G04F 10/005 |
| 2018/0062660 A1 * | 3/2018 | van den Heuvel | ..... | H03L 7/085 |
| 2019/0007055 A1 * | 1/2019 | Nelson | .................. | H03L 7/0807 |
| 2019/0280699 A1 * | 9/2019 | Janardhanan | ........... | H03L 7/148 |
| 2019/0288695 A1 * | 9/2019 | Yao | ......................... | H03L 7/235 |
| 2020/0076439 A1 * | 3/2020 | Weeks | ................... | H03L 7/0805 |
| 2020/0119740 A1 * | 4/2020 | Spirer | ................... | H03L 7/0991 |

FOREIGN PATENT DOCUMENTS

| | | | | | |
|---|---|---|---|---|---|
| CN | 106209093 A | * | 12/2016 | ........... | H03L 7/1974 |
| CN | 109104185 B | * | 6/2022 | ............. | H03K 5/135 |
| KR | 20220027737 A | * | 3/2022 | | |
| WO | WO-2015113308 A1 | * | 8/2015 | ........... | H03L 7/0893 |
| WO | WO-2022128049 A1 | * | 6/2022 | | |

* cited by examiner

*Primary Examiner* — Adam D Houston (57) ABSTRACT

A time-to-digital converter (TDC) circuit includes phase error calculation circuitry to: determine phase error values based on a time difference between a input reference clock and a feedback clock of a digital phase-locked loop (DPLL) circuit, the input reference clock and the feedback clock being unsynchronized; and provide the phase error values to a digital loop filter (DLF) of the DPLL circuit. The TDC circuit further includes clock generation circuitry to: generate a filter clock that asserts a clock pulse in response to detecting each last-received pulse of the input reference clock and the feedback clock; and provide the filter clock to the DLF concurrently with providing the phase error values to the DLF that are synchronized to the filter clock.

20 Claims, 5 Drawing Sheets

INDEPENDENTLY CLOCKING DIGITAL LOOP FILTER BY TIME-TO-DIGITAL CONVERTER IN DIGITAL PHASE-LOCKED LOOP

TECHNICAL FIELD

This disclosure relates to digital phase-locked loops, and more specifically, to independently clocking digital loop filter by time-to-digital converter in phase-locked loop.

BACKGROUND

A phase-locked loop (PLL) is a control system that generates an output signal whose phase is related to the phase of an input signal. There are several different types, but the simplest is an electronic circuit that includes a variable frequency oscillator and a phase detector in a feedback loop. The oscillator generates a periodic signal, and the phase detector compares the phase of that signal with the phase of the input periodic signal, adjusting the oscillator to keep the phases matched. Thus, the PLL operates on two inputs that can be understood as an input reference clock and a feedback clock. Part of the function of the PLL is to approximate the delay between these two inputs in order to make matching adjustments, until the output "locks" onto the frequency and phase of the input reference clock.

In certain digital PLLs (DPLLs), a digitally-controlled oscillator (DCO) is described as a code-to-frequency circuit, where for each input code, there is a unique output frequency. In order to adjust for a time difference between the input reference clock and the feedback clock, a time-to-digital converter (TDC) generates digital bits (e.g., a series of pulses) as the input code that triggers the DCO to adjust a frequency of the output signal of the DPLL. A digital loop filter (DLF) is employed between the TDC and the DCO to digitally filter the digital bits in regards to a frequency response so that the digital bits are accurate and the DCO can stably, with acceptable noise, modulate the output frequency based on the filtered digital bits.

In certain DPLLs, these digital bits that the DLF receives from TDC are out of synch (e.g., asynchronous) with the input reference clock that the DLF also receives. Thus, a separate synchronization circuit is employed between the TDC and the DLF in order to synchronize the reference clock to the data being passed as digital bits. This extra synchronization stage adds in another clock cycle, which creates delay in the operation of the DPLL that in turn causes jitter in the output signal. This separate synchronization circuit also adds cost and area to the DPLL design.

DETAILED DESCRIPTION

The following description sets forth numerous specific details such as examples of specific systems, components, methods, and so forth, in order to provide a good understanding of various embodiments of a digital phase-locked loop (DPLL) described herein. Such DPLLs may be employed in memory control units in different types of transportation vehicles or in any number of other applications such as home automation and security. It will be apparent to one skilled in the art, however, that at least some embodiments may be practiced without these specific details. In other instances, well-known components, elements, or methods are not described in detail or are presented in a simple block diagram format in order to avoid unnecessarily obscuring the subject matter described herein. Thus, the specific details set forth hereinafter are merely exemplary. Particular implementations may vary from these exemplary details and still be contemplated to be within the spirit and scope of the present embodiments.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Figure 1:
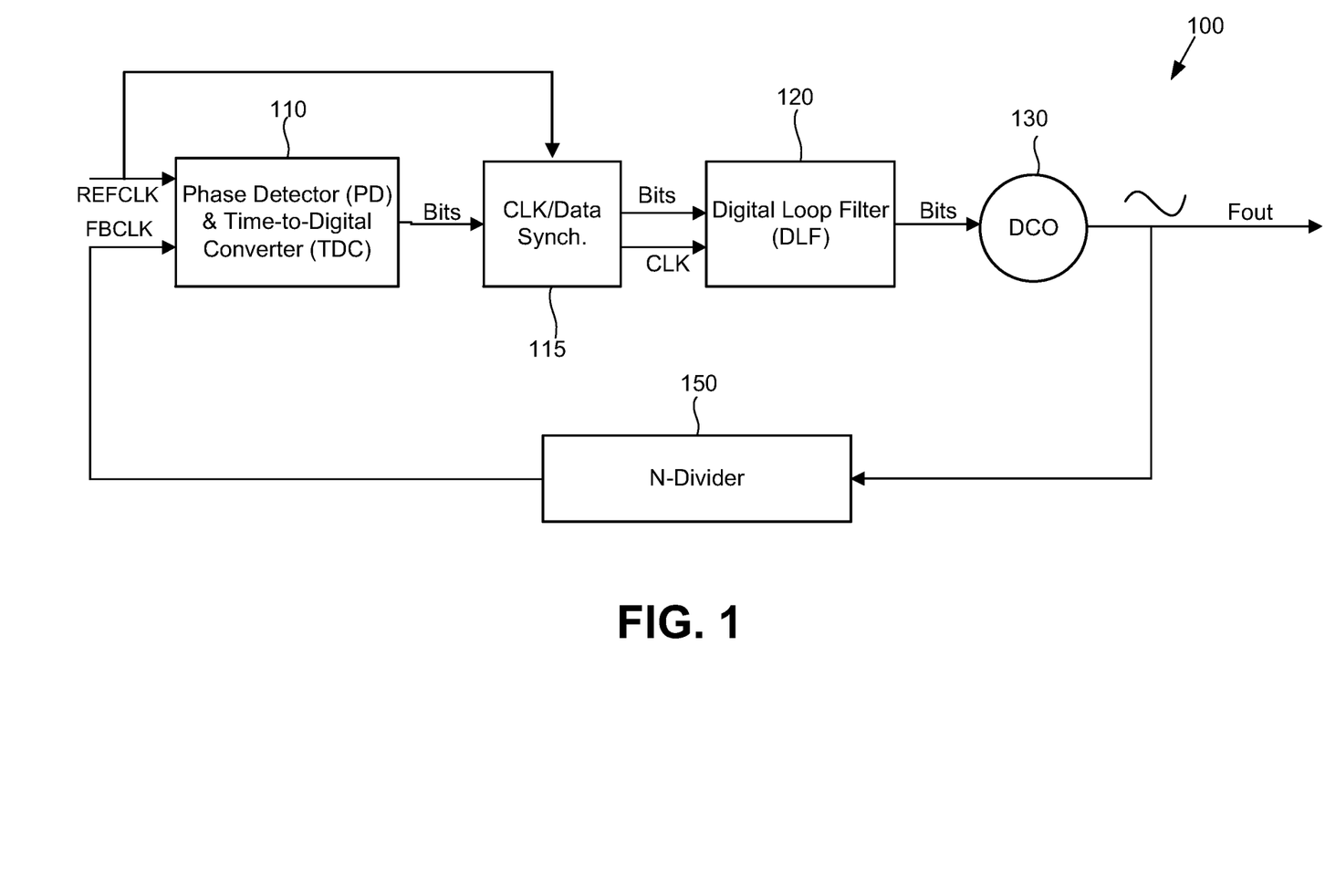
FIG. 1 is a simplified block diagram of a digital phase-locked loop (DPLL) employed in certain electronic devices.

FIG. 1 is a simplified block diagram of a digital phase-locked loop (DPLL) 100 employed in certain electronic devices. In some cases, the DPLL 100 includes a phase detector (PD) and time-to-digital converter (TDC) 110, a clock-to-data synchronizer 115, a digital loop filter (DLF) 120, a digitally-controlled oscillator (DCO) 130, and a frequency divider 150, generally coupled together in a loop, as illustrated. In such DPLL 100, the PD (of the PD & TDC 110) is adapted to detect a phase and frequency of an input reference clock (REFCLCK) and a feedback clock (FBCLK). Further, in the DPLL 100, the TDC of the PD & TDC 110 is configured to determine a time difference (e.g., a phase error) between the reference frequency (Fref) of the input reference clock and the feedback frequency (Fb) of the feedback clock.

The TDC of the PD & TDC 110 generates a multi-bit code that digitally encodes the time difference (e.g., quantifies the phase error) and is designed to trigger the DCO 130 to adjust an output frequency (Fout) of an alternating-current (AC) output signal of the DPLL 100. The DCO 130 of DPLLs is generally implemented as a code-to-frequency circuit, where for each input code (e.g., set of digital bits or pulses), there is a unique output frequency if the DCO 130. The DLF 120, which is coupled between the TDC and the DCO 130, is configured to digitally filter the multi-bit code to ensure these bits are accurate and the DCO 130 can stably, with acceptable noise, modulate the output frequency based on the filtered digital bits or code.

In various applications, the DPLL 100 may be employed in battery-powered consumer electronics, lower-power wireless sensors, home automation systems, remote controls, and automotive memory control units (MCUs), for example, where low cost, low power, fewer bill of materials (BOM), or smaller size are highly desired. The DLF 120 is generally implemented as an on-chip integrated loop filter to further keep the design smaller than analog counterparts. The frequency divider 150 divides the output frequency of the AC output signal by an integer value (N) in order to generate the feedback clock that flows back into the PD & TDC 110. The DPLL 100 is thus designed to operate in a feedback loop in which the time difference between the input reference clock and the feedback clock is minimized until "locking" onto the frequency and phase of the input reference clock.

Figure 2A:
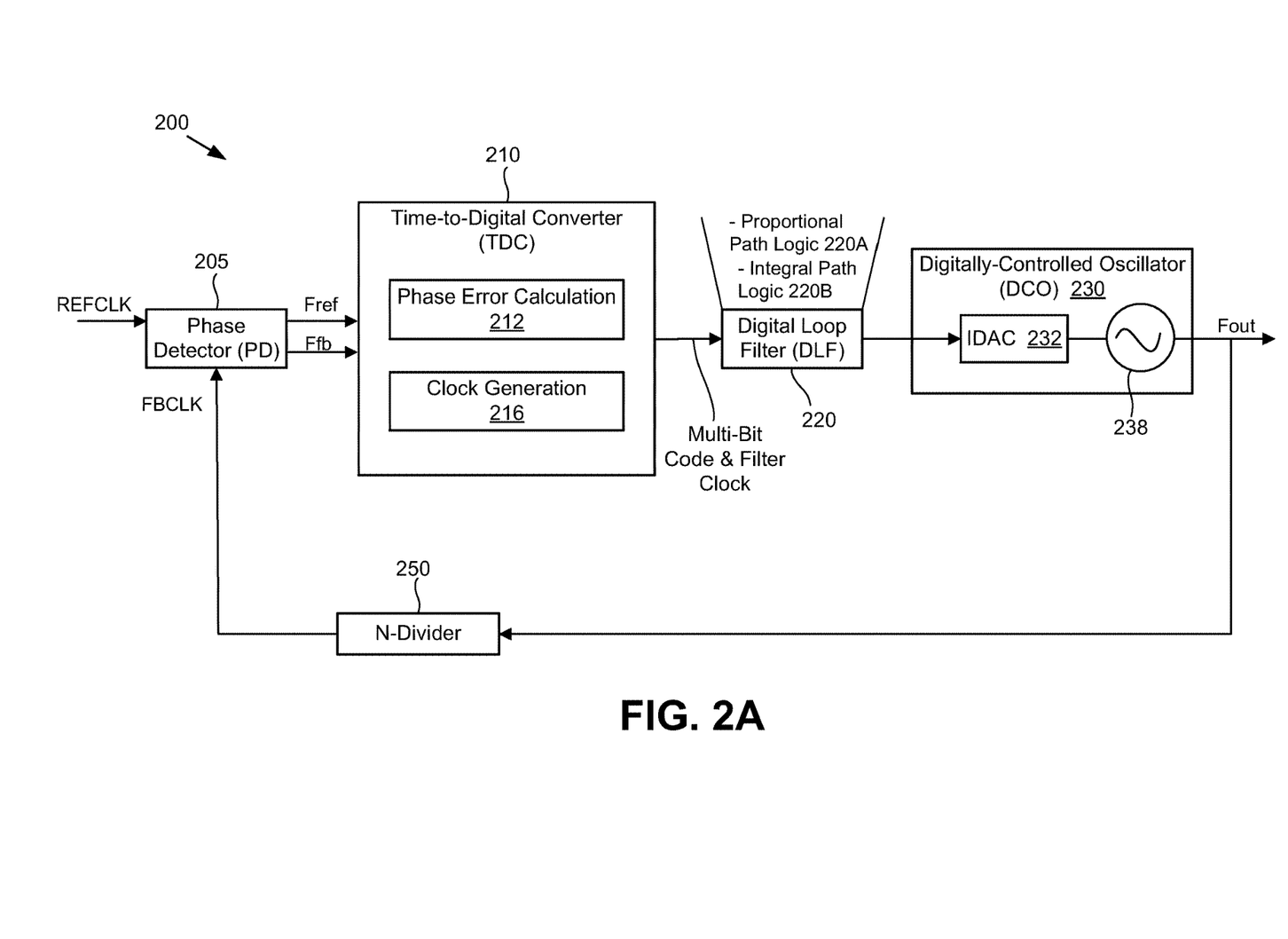
FIG. 2A is a more-detailed block diagram of a DPLL in accordance with at least some embodiments.

In certain DPLLs such as the DPLL 100, the digits bits that the DLF 120 receives from TDC are out of synch (e.g., asynchronous) with the input reference clock that the DLF 120 also receives. Thus, a separate synchronization circuit, such as the clock-to-data synchronizer 115, is employed between the TDC and the DLF 120 in order to synchronize the reference clock to the data being passed as digital bits. This extra synchronization stage adds in another clock cycle, which creates delay in the operation of the DPLL that in turn causes jitter in the output signal. This separate synchronization circuit also adds cost and area to the DPLL design FIG. 2A is a more-detailed block diagram of a digital PLL (or DPLL 200) in accordance with at least some embodiments, which is designed to resolve the deficiencies of certain DPLLs that were discussed with reference to FIG. 1. The DPLL 200, in various embodiments, may be a DPLL circuit, a DPLL device, or a DPLL apparatus. The DPLL 200, for example, may include a phase detector (PD) 205, a time-to-digital converter (TDC) circuit 210 operatively coupled to the PD 205, a digital loop filter (DLF) 220 operatively coupled to the TDC circuit 210, a digitally-controlled oscillator (DCO) circuit 230 coupled to the DLF 220, and a frequency divider 250 coupled between an output of the DCO circuit 230 and the PD 205.

In these embodiments, the PD 205 is configured to detect a phase and frequency of an input reference clock (REFCLCK) and a feedback clock (FBCLK), e.g., so as to be able to provide the reference frequency (Fref) and phase of the input reference clock and the feedback frequency (Ffb) and phase of the feedback clock to the TDC circuit 210. Further, in at least one embodiment, the TDC circuit 210 includes phase error calculation circuitry 212 adapted to determine phase error values based on a time difference between the input reference clock and the feedback clock of a DPLL 200. The input reference clock and the feedback clock are unsynchronized, as was discussed with reference to FIG. 1, so pulses of each of these clocks may include some time difference that may be encoded as phase error values. In this at least one embodiment, the phase error calculation circuitry 212 further provides the phase error values to the DLF 220 of the DPLL 200.

In some embodiments, the phase error values are a series of digital bits or pulses such as a digital multi-bit code that digitally encodes the time difference (or phase error) and are designed to trigger the DCO circuit 230 to adjust an output frequency (Fout) of an alternating-current (AC) output signal of the DPLL 200. The DCO circuit 230 thus generates an output signal that is convertible to the feedback clock, e.g., via the frequency divider 250. For example, the feedback divider 250 may generate the feedback clock by reducing a frequency of the output signal of the DCO circuit 230 by an integer value (e.g., N).

In at least some embodiments, the DLF 220 digitally filters the multi-bit code (e.g., series of digital bits) received from the TDC circuit 210 to generate a filtered series of digital bits that are capable of accurately driving the DCO circuit 230. The DLF 220, for example, may include proportional path logic 220A having a first gain and integral path logic 220B having a second gain. In some embodiments, the DLF 220 implements a z-domain transfer function to process a combination of a proportional part of the multi-bit code multiplied by the first gain and an integral part of the multi-bit code multiplied by the second gain. The proportional path logic 220A and the integral path logic 220B may both be instantiated in an on-chip integrated loop filter of the DPLL 200, for example.

In at least some embodiments, and to overcome the deficiencies of previous designs, the TDC circuit 210 of the DPLL 200 further includes clock generation circuitry 216. In these embodiments, the clock generation circuitry 216 generates a filter clock that asserts a clock pulse in response to detecting each last-received pulse of the input reference clock and the feedback clock (see FIGS. 3A-3B). In these embodiments, the clock generation circuitry 216 is further to provide the filter clock to the DLF 220 concurrently with providing the phase error values (e.g., series of digital bits) to the DLF 220 that are synchronized to the filter clock. In this way, the clock generation circuitry 216 synchronizes the phase error values with the clock pulses of the filter clock due to triggering these clock pulses off the last-received pulse of the input reference clock and the feedback clock, e.g., not relying only on the reference clock that is not synchronized to the phase error values. In some embodiments, the phase error values are a series of digital bits or a multi-bit code, as was discussed. The clock generation circuitry 216 is discussed in more detail with reference to FIG. 2B.

Further, in these embodiments, the DCO circuit 230 includes a current digital-to-analog converter (IDAC) 232 coupled to a ring oscillator 238. For example, the IDAC 232 may convert the phase error values (e.g., the series of digital bits) to a current that is supplied to the ring oscillator 238. The ring oscillator 238 generates an AC output signal (Fout) of the DPLL 200 that corresponds to the received current from IDAC 232. The output signal is convertible by the frequency divider 250 in generating the feedback clock (FBCLK) supplied to the PD 205.

Figure 2B:
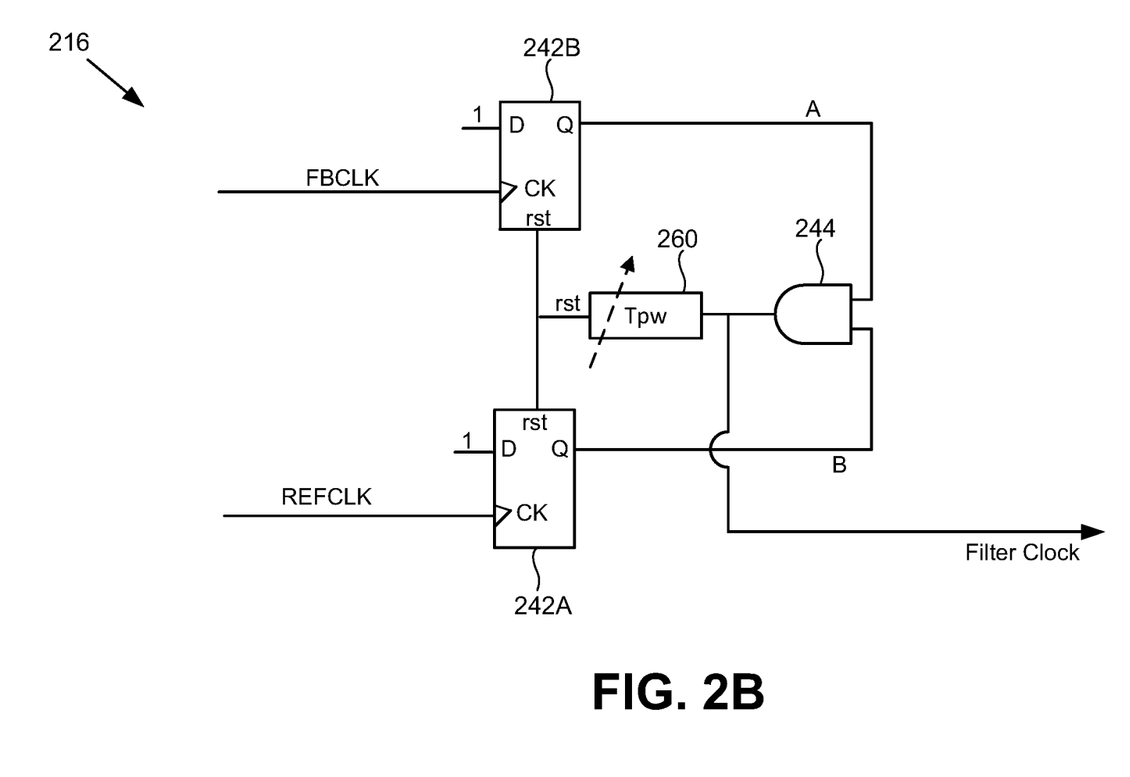
FIG. 2B is a schematic circuit diagram of the clock generation circuitry of the TDC of FIG. 2A in accordance with at least some embodiments.

FIG. 2B is a schematic circuit diagram of the clock generation circuitry 216 of the TDC 210 of the DPLL 200 (FIG. 2A) in accordance with at least some embodiments. In these at least some embodiments, the clock generation circuitry 216 includes a first latch 242A that is triggered by the input reference clock (REFCLK), a second latch 242B that is triggered by the feedback clock (FBCLK), and an AND gate 244 that is coupled to outputs of each of the first latch and the second latch and outputs the filter clock. In this way, as illustrated in FIGS. 3A-3B, once the last-received pulse between the input reference clock and the feedback clock is received, both the first latch 242A and the second latch 242B assert outputs and the output of the AND gate 244 is also asserted, which starts a next pulse of the filter clock.

In some embodiments, each of the first latch 242A and the second latch 242B are gated D-latches, which prevents application of a restricted input combination. The gated D-latches, also referred to as transparent latches, data latches, or simply gated latches or gated flip-flops, each has a data input ("1" in this embodiment) and an enable signal, which in this embodiment is the input clock, e.g., the input reference clock in the first latch 242A and the feedback clock in the second latch 242B. Thus, a one value is provided to inputs of the each of the first latch 242A and second latch 242B and these clock signals act as enables signals for the first latch 242A and the second latch 242B. In other embodiments, different kinds of latches are employed with optionally different external circuitry to trigger the pulses of the filter clock.

In at least some embodiments, the clock generation circuitry 216 further includes a pulse width modulation (PWM) circuit 260 coupled to an output of the AND gate 244. In these embodiments, the PWM circuit 260 sets a pulse width of each clock pulse of the filter clock and resets the first latch and the second latch at an end of each pulse width, completing the controlled formation of the filter clock that is provided to the DLF 220. In this way, the TDC 210 independently generates the filter clock, reducing the number of clock cycles, cost, and chip area needed to generate the filter clock, which in turn reduces the jitter of the output signal generated by the DCO 230.

Figure 3A:
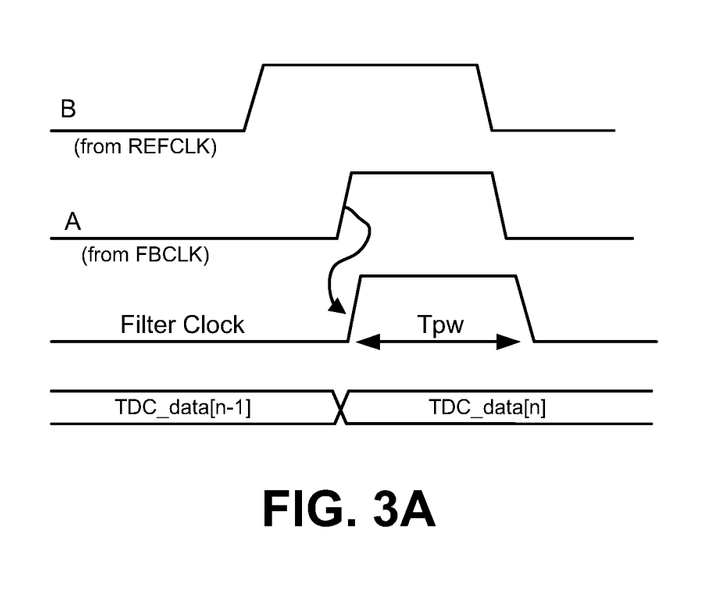
FIGS. 3A-3B are graphs of a filter clock that is output from the clock generation circuitry in accordance with at least some embodiments.
Figure 3B:
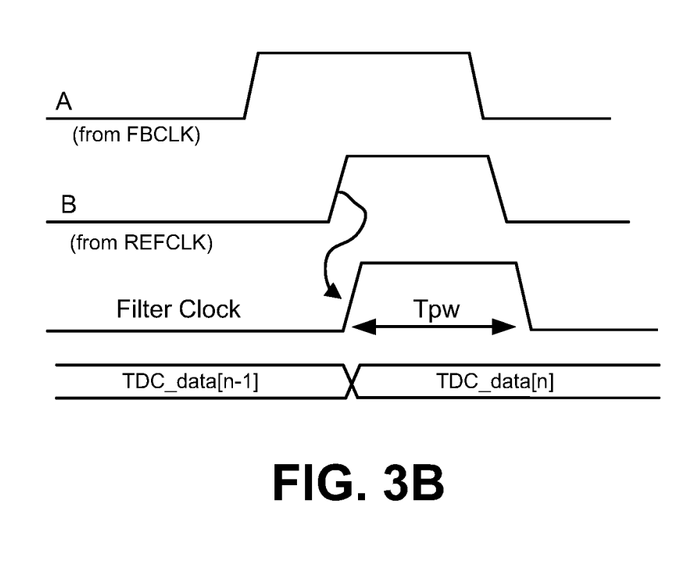

FIGS. 3A-3B are graphs of a filter clock that is output from the clock generation circuitry 216 in accordance with at least some embodiments. As mentioned, the PWM circuit 260 generates a filter clock that asserts a clock pulse in response to detecting each last-received pulse of the input reference clock and the feedback clock. The graph of FIG. 3A illustrates that a pulse from the input reference clock (REFCLK) has arrived first and a pulse from the feedback clock (FBCLK) has arrived last at the clock generation circuitry 216 of the TDC 210. Thus, the clock generation circuitry 216 asserts a pulse of the filter clock in response to detecting this last-received pulse of the feedback clock. The TDC data (series of digital bits) that is also passing through the TDC 210 is illustrated below the filter clock waveform, illustrating that the filter clock has been synchronized to the data transition all within the TDC 210. Thus, the need for the extra, external clock-to-data synchronizer 115 (FIG. 1) has been eliminated.

Similarly, the graph of FIG. 3B illustrates that a pulse from the feedback clock has arrived first and a pulse from the input reference clock has arrived last at the clock generation circuitry 216 of the TDC 210. Thus, the clock generation circuitry 216 asserts a pulse of the filter clock in response to detecting this last-received pulse of the feedback clock. The TDC data (series of digital bits) that is also passing through the TDC 210 is illustrated below the filter clock waveform, illustrating that the filter clock has been synchronized to the data transition all within the TDC 210. Thus, the need for the extra, external clock-to-data synchronizer 115 (FIG. 1) has been eliminated.

Figure 4:
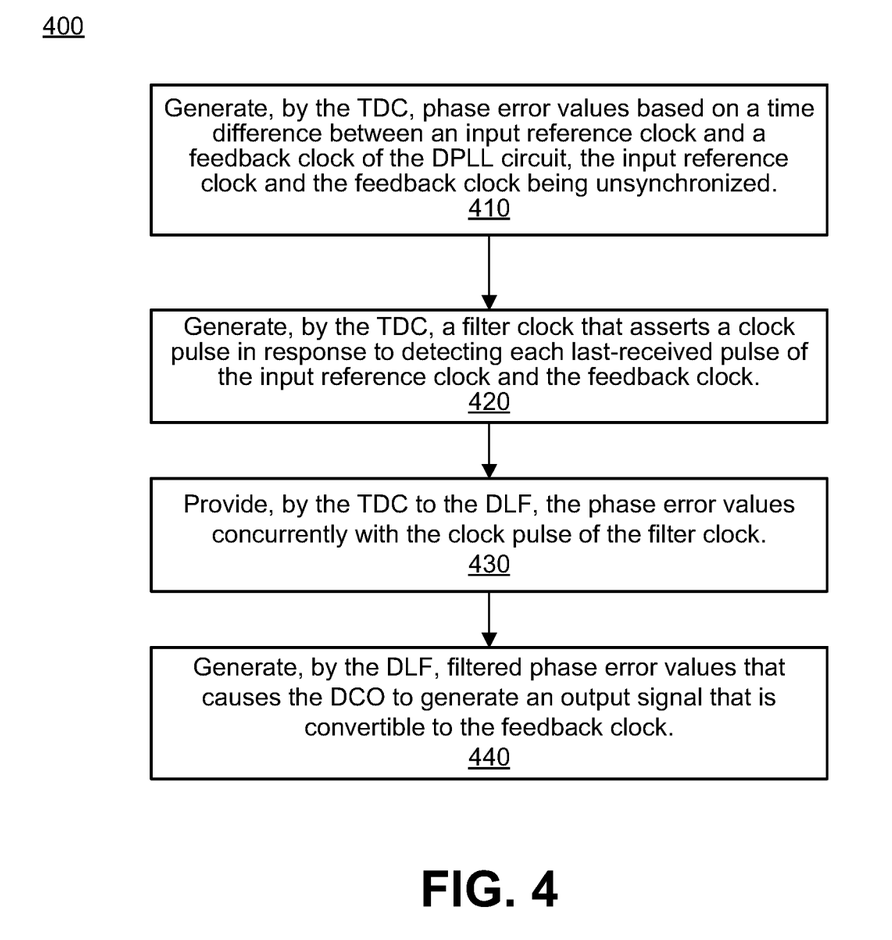
FIG. 4 is a flow diagram of method of operating a DPLL that employs the clock generation circuitry in accordance with at least some embodiments.

FIG. 4 is a flow diagram of method 400 of operating the DPLL 200 that employs the clock generation circuitry 216 in accordance with at least some embodiments. Thus, in these embodiments, the method 400 is performed by the DPLL 200, and particularly the TDC circuit 210 of the DPLL 200 illustrated in FIG. 2. The operations need not be performed in a specific order, unless explicitly disclosed to be required to be performed in such an order.

At operation 410, the method 400 begin with generating, by the TDC 210, phase error values based on a time difference between an input reference clock and a feedback clock of the DPLL circuit 200, the input reference clock and the feedback clock being unsynchronized.

At operation 420, the method 400 continues with generating, by the TDC 210, a filter clock that asserts a clock pulse in response to detecting each last-received pulse of the input reference clock and the feedback clock.

At operation 430, the method continues by providing, by the TDC 210 to the DLF 220, the phase error values concurrently with the clock pulses of the filter clock.

At operation 440, the method continues by generating, by the DLF 220, filtered phase error values that causes the DCO to generate an output signal that is convertible to the feedback clock.

In at least some embodiments, the method 400 further includes synchronizing, by the TDC 210, the generating the phase error values with the generating the clock pulses, where the phase error values are a series of digital bits. This synchronization may be ensured by the operation 420 and/or triggering off the phase error values generated by the phase error correction circuitry 212, which was discussed with reference to FIG. 2A.

Various embodiments of the AC-DC flyback converter described herein may include various operations. These operations may be performed and/or controlled by hardware components, digital hardware and/or firmware, and/or combinations thereof. As used herein, the term "coupled to" may mean connected directly to or connected indirectly through one or more intervening components. Any of the signals provided over various on-die buses may be time multiplexed with other signals and provided over one or more common on-die buses. Additionally, the interconnection between circuit components or blocks may be shown as buses or as single signal lines. Each of the buses may alternatively be one or more single signal lines and each of the single signal lines may alternatively be buses.

Certain embodiments may be implemented by firmware instructions stored on a non-transitory computer-readable medium, e.g., such as volatile memory and/or non-volatile memory. These instructions may be used to program and/or configure one or more devices that include processors (e.g., CPUs) or equivalents thereof (e.g., such as processing cores, processing engines, microcontrollers, and the like), so that when executed by the processor(s) or the equivalents thereof, the instructions cause the device(s) to perform the described operations for USB-C mode-transition architecture described herein. The non-transitory computer-readable storage medium may include, but is not limited to, electromagnetic storage medium, read-only memory (ROM), random-access memory (RAM), erasable programmable memory (e.g., EPROM and EEPROM), flash memory, or another now-known or later-developed non-transitory type of medium that is suitable for storing information.

Although the operations of the circuit(s) and block(s) herein are shown and described in a particular order, in some embodiments the order of the operations of each circuit/block may be altered so that certain operations may be performed in an inverse order or so that certain operation may be performed, at least in part, concurrently and/or in parallel with other operations. In other embodiments, instructions or sub-operations of distinct operations may be performed in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A time-to-digital converter (TDC) circuit comprising:
phase error calculation circuitry to:
    determine phase error values based on a time difference between a input reference clock and a feedback clock of a digital phase-locked loop (DPLL) circuit, the input reference clock and the feedback clock being unsynchronized; and
    provide the phase error values to a digital loop filter (DLF) of the DPLL circuit; and
clock generation circuitry to:
    generate a filter clock that asserts a clock pulse in response to detecting each last-received pulse of the input reference clock and the feedback clock; and
    provide the filter clock to the DLF concurrently with providing the phase error values to the DLF that are synchronized to the filter clock.

2. The TDC circuit of claim 1, wherein the phase error values comprise a series of digital bits.

3. The TDC circuit of claim 1, wherein the clock generation circuitry comprises:
a first latch that is triggered by the input reference clock;
a second latch that is triggered by the feedback clock; and
an AND gate that receives outputs of each of the first latch and the second latch and outputs the filter clock.

4. The TDC circuit of claim 3, wherein each of the first latch and the second latch are gated D-latches.

5. The TDC circuit of claim 3, wherein the clock generation circuitry further comprises a pulse width modulation (PWM) circuit coupled to an output of the AND gate, the PWM circuit to:
set a pulse width of each clock pulse of the filter clock; and
reset the first latch and the second latch at an end of each pulse width.

6. The TDC circuit of claim 3, wherein a one value is provided to inputs of each of the first latch and the second latch.

7. A digital phase-locked loop (DPLL) circuit comprising:
digital loop filter (DLF) configured to operate according to a filter clock generated by a time-to-digital converter (TDC);
the TDC operatively coupled to the DLF and comprising:
    phase error calculation circuitry to:
        determine phase error values based on a time difference between a input reference clock and a feedback clock of the DPLL circuit, the input reference clock and the feedback clock being unsynchronized; and
        provide the phase error values to the DLF; and
    clock generation circuitry to:
        generate the filter clock that asserts a clock pulse in response to detecting each last-received pulse of the input reference clock and the feedback clock; and
        provide the filter clock to the DLF concurrently with providing the phase error values to the DLF that are synchronized to the filter clock; and
a digitally-controlled oscillator (DCO) coupled to the DLF and configured to generate an output signal that is convertible to the feedback clock.

8. The DPLL circuit of claim 7, wherein the phase error values comprise a series of digital bits.

9. The DPLL circuit of claim 7, wherein the clock generation circuitry comprises:
a first latch that is triggered by the input reference clock;
a second latch that is triggered by the feedback clock; and
an AND gate that receives outputs of each of the first latch and the second latch and outputs the filter clock.

10. The DPLL circuit of claim 9, wherein each of the first latch and the second latch are gated D-latches.

11. The DPLL circuit of claim 9, wherein the clock generation circuitry further comprises a pulse width modulation (PWM) circuit coupled to an output of the AND gate, the PWM circuit to:
set a pulse width of each clock pulse of the filter clock; and
reset the first latch and the second latch at an end of each pulse width.

12. The DPLL circuit of claim 9, wherein a one value is provided to inputs of each of the first latch and the second latch.

13. The DPLL circuit of claim 7, further comprising a feedback divider to generate the feedback clock by reducing a frequency of the output signal by an integer value.

14. A method of operating a digital phase-locked loop (DPLL) circuit, the method comprising:
generating, by a time-to-digital converter (TDC), phase error values based on a time difference between an input reference clock and a feedback clock of the DPLL circuit, the input reference clock and the feedback clock being unsynchronized;
generating, by the TDC, a filter clock that asserts a clock pulse in response to detecting each last-received pulse of the input reference clock and the feedback clock;
providing, by the TDC to a digital loop filter (DLF), the phase error values concurrently with the clock pulses of the filter clock; and
generating, by the DLF, filtered phase error values that causes a digitally-controlled oscillator (DCO) to generate an output signal that is convertible to the feedback clock.

15. The method of claim 14, further comprising synchronizing, by the TDC, the generating the phase error values with the generating the clock pulses, wherein the phase error values comprise a series of digital bits.

16. The method of claim 14, wherein the TDC comprises a first latch, a second latch, and an AND gate coupled to outputs of the first latch and the second latch, and wherein the method of operating the DPLL circuit further comprises:
causing the first latch to be triggered by the input reference clock;
causing the second latch to be triggered by the feedback clock; and
causing outputs of each of the first latch and the second latch to be provided to the AND gate.

17. The method of claim 16, wherein each of the first latch and the second latch are gated D-latches.

18. The method of claim 16, wherein the TDC further comprises a pulse width modulation (PWM) circuit coupled to an output of the AND gate, and the method of operating the DPLL circuit further comprises:
causing the PWM circuit to set a pulse width of each clock pulse of the filter clock; and
causing the first latch and the second latch to each be reset at an end of each pulse width.

19. The method of claim 16, wherein the method of operating the DPLL circuit further comprises providing a one value to inputs of each of the first latch and the second latch.

20. The method of claim 14, wherein the DPLL circuit further comprises a feedback divider, and the method of operating the DPLL circuit further comprises generating, by the feedback divider, the feedback clock by reducing a frequency of the output signal by an integer value.

\* \* \* \* \*